United States Patent [19]

Sugibayashi

[11] Patent Number: 5,369,620
[45] Date of Patent: Nov. 29, 1994

[54] DYNAMIC RANDOM ACCESS MEMORY DEVICE HAVING COLUMN SELECTOR FOR SELECTING DATA LINES CONNECTABLE WITH BIT LINES

[75] Inventor: Tadahiko Sugibayashi, Tokyo, Japan

[73] Assignee: NEC Corporation, Tokyo, Japan

[21] Appl. No.: 92,061

[22] Filed: Jul. 16, 1993

[30] Foreign Application Priority Data

Jul. 16, 1992 [JP] Japan .................. 4-188519

[51] Int. Cl.5 ................ G11C 7/00; G11C 8/00
[52] U.S. Cl. ............... 365/230.03; 365/189.01; 365/189.04
[58] Field of Search ......... 385/230.03, 189.01, 385/203, 189.04, 189.03

[56] References Cited

U.S. PATENT DOCUMENTS

| 4,758,990 | 7/1988 | Uchida | 365/203 |
|---|---|---|---|
| 4,878,203 | 10/1989 | Arakawa | 365/230.03 |
| 4,926,387 | 5/1990 | Madland | 365/203 |
| 4,939,691 | 7/1990 | Mizukami et al. | 365/203 X |
| 5,157,631 | 10/1992 | Shimogawa | 365/203 |

FOREIGN PATENT DOCUMENTS 0013288  1/1989  Japan .................. 365/203

OTHER PUBLICATIONS

M. Taguchi et al., "A 40ns 64Mb DRAM with Current-Sensing Data-Bus Amplifier", ISSCC91, Session 6, High-Density DRAM, Paper TA 6.5, Feb. 14, 1991.

T. Mano et al., "Circuit Technologies for 16Mb DRAMs", 1987 IEEE International Solid-State Circuits Conference, ISSCC87, Feb. 25, 1987, pp. 22-23 and 324.

Primary Examiner—Eugene R. LaRoche
Assistant Examiner—Son Dinh
Attorney, Agent, or Firm—Sughrue, Mion, Zinn, Macpeak & Seas

[57] ABSTRACT

A plurality of data line pairs incorporated in a dynamic random access memory device extend over circuit components in parallel to a bit line pairs, and propagate a data bit between a read/write amplifier circuit and a sense amplifier unit shared between two memory cell blocks, wherein a column selector selectively charges one of the plurality of data line pairs before propagating the data bit so that a concentrated column selecting system and the data line pairs over the circuit components make the random access memory device possible to be fabricated on a relatively small semiconductor chip.

6 Claims, 10 Drawing Sheets

DYNAMIC RANDOM ACCESS MEMORY DEVICE HAVING COLUMN SELECTOR FOR SELECTING DATA LINES CONNECTABLE WITH BIT LINES

FIELD OF THE INVENTION

This invention relates to a dynamic random access memory device and, more particularly, to a dynamic random access memory device having a column selector for selecting data lines connectable with bit lines.

DESCRIPTION OF THE RELATED ART

A typical example of the dynamic random access memory device is illustrated in FIG. 1, and largely comprises a plurality of memory cell blocks 1a, 1b, 1c, 1d, 1e, 1f and 1g, a plurality of data selecting/propagating blocks 2a, 2b, 2c, 2d, . . . and 2h, a row address decoder/word line driver unit 3 shared between all of the memory cell blocks 1a to 1g and a column address decoder unit 4 also shared between all of the data selecting/propagating blocks 2a to 2h. Though not shown in FIG. 1, each of the memory cell blocks 1a to 1g is implemented by a plurality of memory cells arranged in a matrix, and word lines and bit line pairs are respectively coupled with the rows of memory cells and the columns of memory cells. The row address decoder/word line driving unit 3 is responsive to row address predecoded signals, and selectively drives the word lines. Column address predecoded signals are supplied to the column address decoder unit 4, and selectively drive decoded signal lines YSW1 to YSWn. The selected word line and the selected decoded signal line allow one of or a plurality of memory cell blocks 1a to 1g to be accessible, and a data bit of data bits is written thereinto or read out therefrom.

Each of the data selecting/propagating blocks 2a to 2h is available for the two memory cell blocks adjacent to it and all of the data selecting/propagating blocks 2a to 2h are similar in arrangement to one another. The circuit arrangement of the data selecting/propagating block 2b is illustrated in FIG. 2 in detail.

Turning to FIG. 2 of the drawings, the data selecting/propagating block 2b is associated with the memory cell blocks 1b and 1c, and largely comprises a first transfer gate array 5a, a second transfer gate array 5b, an array of sense amplifier circuits SA1 to SAn, a first column selector 6a and a second column selector 6b.

The first transfer gate array 5a is implemented by a plurality pairs of n-channel enhancement type transfer transistors Qn11/Qn12 to Qn1m/Qn1n, and the pairs of n-channel enhancement type transfer transistors Qn11/Qn12 to Qn1m/Qn1n are respectively coupled with bit line pairs BLa1 to BLan associated with the memory cell block 1b.

Similarly, the second transfer gate array 5b is implemented by a plurality pairs of n-channel enhancement type transfer transistors Qn21/Qn22 to Qn2m/Qn2n, and the pairs of n-channel enhancement type transfer transistors Qn21/Qn22 to Qn2m/Qn2n are coupled with bit line pairs BLb1 to BLbn associated with the other memory cell block 1c.

The array of sense amplifier circuits SA1 to SAn is shared between the memory cell blocks 1b and 1c, and one of the first and second transfer gate arrays 5a and 5b couples the associated bit line pairs BLa1 to BLan or BLb1 to Blbn with the array of sense amplifier circuits SA1 to SAn. Each of the sense amplifier circuits SA1 to SAn is implemented by two complementary inverters, i.e., two series combinations of p-channel enhancement type switching transistors and n-channel enhancement type switching transistors Qp1/Qn2 and Qp3/Qn4 coupled between power supply lines SAP and SAN, and the input node IN1 or IN2 of one of the complementary inverters is coupled with the output node OUT2 or OUT1 of the other of the complementary inverters for developing potential difference on the associated bit line pair.

The first column selector 6a is associated with a pair of read-out data lines RL and CRL, and is implemented by a plurality pairs of series circuits of n-channel enhancement type switching transistors Qn31/Qn41 and Qn32/Qn42 to Qn3m/Qn4m and Qn3n/Qn4n coupled between the pair of read-out data lines RL and CRL and a ground voltage line GND. The plurality pairs of series circuits are respectively associated with the sense amplifier circuits SA1 to SAn, and are selectively enabled with the decoded signal lines YSW1 to YSWn. Namely, the decoded signal lines YSW1 to YSWn are coupled with the gate electrodes of the n-channel enhancement type switching transistors Qn31/Qn32 to Qn3m/Qn3n, and the column address decoder unit 4 drives one of the decoded signal lines YSW1 to YSWn to active high voltage level. While one of the decoded signal lines YSW1 to YSWn is staying at the active high voltage level, the n-channel enhancement type switching transistors Qn31/Qn32 or Qn3m/Qn3n coupled therewith turn on so as to couple the associated n-channel enhancement type switching transistors Qn41/Qn42 or Qn4m/Qn4n with the read-out data lines RL and CRL. As a result, one of the sense amplifier circuits SA1 to SAn is selected from the array, and the potential difference is transferred from the selected sense amplifier circuit through the first column selector 6a to the pair of read-out data lines RL and CRL.

The second column selector 6b is associated with a pair of write-in data lines WL and CWL, and is also implemented by a plurality pairs of series circuits of n-channel enhancement type switching transistors Qn51/Qn61 and Qn52/Qn62 to Qn5m/Qn6m and Qn5n/Qn6n coupled between the pair of write-in data lines WL and CWL and the sense amplifier circuits SA1 to SAn. The plurality pairs of series circuits are simultaneously enabled with a write enable signal WS, and are respectively controlled with the decoded signal lines YSW1 to YSWn. Namely, the decoded signal lines YSW1 to YSWn are coupled with the gate electrodes of the n-channel enhancement type switching transistors Qn61/Qn62 to Qn6m/Qn6n, and the column address decoder unit 4 drives one of the decoded signal lines YSW1 to YSWn to the active high voltage level. While one of the decoded signal lines YSW1 to YSWn is staying at the active high voltage level, the n-channel enhancement type switching transistors Qn61/Qn62 or Qn6m/Qn6n coupled therewith turn on so as to couple the associated sense amplifier circuit SA1 or SAn with the write-in data lines WL and CWL. As a result, potential difference indicative of a write-in data bit is supplied from the write-in data lines WL and CWL through the second column selector 6b to the selected sense amplifier circuit SA1 or SAn, and the potential difference is supplied to one of the bit line pairs after the development.

The prior art dynamic random access memory device thus arranged selectively enters a read-out mode and a write-in mode of operation, and a read-out sequence and a write-in sequence are respectively illustrated in FIGS. 3 and 4. Although small potential differences are supplied from one of the memory cell blocks 1b and 1c to the sense amplifier circuits SA1 to SAn for amplification, description is focused upon the sense amplifier circuit SA1 only.

Assuming now that data bits read out from a selected row of either memory cell block 1b or 1c are transferred through the associated transfer gate unit 5a or 5b to the array of sense amplifier circuits SA1 to SAn, a small potential difference dV1 takes place between the nodes N1 and N2 of the sense amplifier circuit SA1, and the read-out data lines RL and CRL are charged to a positive high voltage level H1 lower than a positive power voltage level H2 by the threshold of n-channel enhancement type precharging transistors (not shown). The power voltage lines SAP and SAN are driven to the positive power voltage level H1 and the ground voltage level L at time t1, and starts the sense amplifier circuits SA1 to SAn increasing the potential difference between the nodes N1 and N2 at time t2. The decoded signal line YSW1 goes up from the ground voltage level L toward the positive power voltage level H2 at time t3, and the n-channel enhancement type switching transistors Qn31 and Qn32 turn on so that the read-out data lines RL and CRL are coupled with the associated n-channel enhancement type switching transistors Qn41 and Qn42. The potential difference between the nodes N1 and N2 is relayed to the gate electrodes of the n-channel enhancement type switching transistors Qn41 and Qn42, and the n-channel enhancement type switching transistor Qn41 turns on. However, the other n-channel enhancement type switching transistor Qn42 is turned off, and only the read-out data line RL is coupled through the node N1 and the n-channel enhancement type switching transistor Qn2 with the power supply line SAN. Then, the read-out data line RL goes down from the positive high voltage level at time t4, and the potential difference indicative of the read-out data bit is transferred from the sense amplifier circuit SA1 to the read-out data lines RL and CRL. The read-out data lines RL and CRL propagate the potential difference indicative of the read-out data bit to an associated read data amplifier circuit 7 (see FIG. 1), and the read data amplifier circuit 7 causes an output data buffer (not shown) to produce an output data signal.

If a write-in data bit is supplied to the prior art dynamic random access memory device after entry into the write-in mode, a write data amplifier circuit 8 (see FIG. 1) allows the write-in data line CWL to go down from the positive high voltage level H1 toward the ground voltage level L at time t11, and keeps the other write-in data line WL at the positive power voltage level H1. The column address decoder unit 4 starts the decoded signal line YSW1 going up toward the positive power voltage level H2 at time t12, and the n-channel enhancement type switching transistors Qn61 and Qn62 turn on. However, the other n-channel enhancement type switching transistors Qn6m/Qn6n are turned off, because the associated decoded signal lines remain inactive. The write enable signal WS goes up toward the positive power voltage level H2 at time t13, and all of the n-channel enhancement type switching transistors Qn51/Qn52 to Qn5m/Qn5n turn on. As a result, the write-in data lines WL and CWL are coupled with the nodes N1 and N2 of the sense amplifier circuits SA1, and the potential difference is relayed from the write-in data lines WL and CWL to the sense amplifier circuit SA1. The write-in data bit is opposite in logic level to the refreshed data bit, and the potential levels on the nodes N1 and N2 are changed at time t14.

Thus, a single read-out data bit and a single write-in data bit are transferred between a selected memory cell block and the read data amplifier circuit 7/write data amplifier circuit 8, and the read-out data line pair RL/CRL and the write-in data line pair WL/CWL are necessary for the single read-out data bit and the single write-in data bit, respectively. As described hereinbefore, a substantial amount of real estate is exclusively assigned to the read-out data line pair RL/CRL and the write-in data line pair WL/CWL, and the total amount of real estate occupied by all the data line pairs is not ignoreable. Therefore, the memory cell blocks 1a to 1g are hardly increasable without enlargement of the semiconductor chip.

Since a set of read-out and write-in data line pairs is required for a single data bit, the read-out data line pair RL/CRL and the write-in data line pair WL/CWL should be multiplexed for a plurality of data bits simultaneously read out from and written into a single memory cell block. For example, if the prior art dynamic random access memory device is expected to concurrently write two data bits into one of the memory cell blocks 1b and 1c as well as concurrently read out two data bits from one of the memory cell blocks 1b and 1c, each data selecting/propagating unit requires two pairs of read-out data lines RL1/CRL1 and RL2/CRL2 and two pairs of write-in data lines WL1/CWL1 and WL2/CWL2 as shown in FIG. 5.

This results in a large amount of real estate being exclusively occupied by the read-out data line pairs and the write-in data line pairs, and the above described problem becomes more serious.

SUMMARY OF THE INVENTION

It is therefore an important object of the present invention to provide a dynamic random access memory device which allows an external device to simultaneously write and read out data bits without enlargement of a semiconductor chip.

To accomplish the object, the present invention proposes to cause selectively precharged data lines arranged in parallel to bit lines over circuit components to propagate data bits between a read/write amplifier and a sense amplifier unit.

In accordance with one aspect of the present invention, there is provided a semiconductor memory device fabricated on a single semiconductor chip, comprising: a) a plurality of memory cell blocks each implemented by a plurality of memory cells arranged in rows and columns; b) a plurality sets of bit line pairs each associated with the plurality of memory cell blocks, and each having a plurality of bit line pairs respectively coupled with the columns of memory cells of the associated memory cell block; c) a row selecting system associated with the plurality of memory cell blocks, and selectively allowing the plurality of memory cell blocks to transfer data bits from and to the associated bit line pairs; d) a plurality of data transferring and sensing units each available for two memory cell blocks selected from the plurality of memory cell blocks, each of the plurality of data transferring and sensing units comprising d-1) a plurality of sense amplifier circuits for amplifying potential differences indicative of data bits, respectively, d-2) a first transfer gate unit coupled between the plurality of bit line pairs associated with one of the two memory cell blocks and the plurality of sense amplifier circuits, and responsive to a first transfer signal for transferring the potential differences between the plurality of bit line pairs and the plurality of sense amplifier circuits, d-3) a second transfer gate unit coupled between the plurality of bit line pairs associated with the other of the two memory cell blocks and the plurality of sense amplifier circuits, and responsive to a second transfer signal complementary to the first transfer signal for transferring the potential differences between the plurality of bit line pairs and the plurality of sense amplifier circuits, d-4) a third transfer gate unit coupled with the plurality of sense amplifier circuits, and responsive to a read enable signal for entering on-state, and d-5) a fourth transfer gate unit coupled with the plurality of sense amplifier circuits, and responsive to a write enable signal for entering on-state; e) a plurality of data line pairs arranged in parallel to the plurality of bit line pairs, and coupled with both third and fourth transfer gate units; f) a read/write amplifier unit operative to produce an output data signal from a potential difference indicative of one of the data bits and a new potential difference from an input data signal; and g) a column selecting and precharging means coupled between the read/write amplifier unit and the plurality of data line pairs, and operative to coupled one of the plurality of data line pairs and to charge the aforesaid one of the plurality of data line pairs for producing the potential difference indicative of one of the data bits and the new potential difference thereon.

In accordance with another aspect of the present invention, there is provided a semiconductor memory device fabricated on a single semiconductor chip, comprising: a) a plurality of memory cell blocks each implemented by a plurality of memory cells arranged in rows and columns; b) a plurality sets of bit line pairs each associated with the plurality of memory cell blocks, and each having a plurality of bit line pairs respectively coupled with the columns of memory cells of the associated memory cell block; c) a row selecting system associated with the plurality of memory cell blocks, and selectively allowing the plurality of memory cell blocks to transfer data bits from and to the associated bit line pairs; d) a plurality of data transferring and sensing units each available for two memory cell blocks selected from the plurality of memory cell blocks, each of the plurality of data transferring and sensing units comprising d-1) a plurality of sense amplifier circuits for amplifying potential differences indicative of data bits, respectively, d-2) a first transfer gate unit coupled between the plurality of bit line pairs associated with one of the two memory cell blocks and the plurality of sense amplifier circuits, and responsive to a first transfer signal for transferring the potential differences between the plurality of bit line pairs and the plurality of sense amplifier circuits, d-3) a second transfer gate unit coupled between the plurality of bit line pairs associated with the other of the two memory cell blocks and the plurality of sense amplifier circuits, and responsive to a second transfer signal complementary to the first transfer signal for transferring the potential differences between the plurality of bit line pairs and the plurality of sense amplifier circuits, d-4) a third transfer gate unit having a plurality of first transfer circuits respectively coupled with the plurality of sense amplifier circuits and responsive to a read enable signal indicative of one of the sense amplifier circuits for selectively entering on-state, and d-5) a fourth transfer gate unit having a plurality of second transfer circuits coupled with the plurality of sense amplifier circuits and responsive to a write enable signal indicative of one of the sense amplifier circuits for selectively entering on-state; e) at least one data line pair arranged in parallel to the plurality of bit line pairs, and coupled with both third and fourth transfer gate units; f) a column selecting system coupled with the third and fourth transfer gate units, and selectively producing the read enable signal and the write enable signal for selectively coupling the at least on data line pair with the plurality of sense amplifier circuits; and g) a read/write amplifier unit operative to selectively drive the at least one data line pair for producing potential differences thereon.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
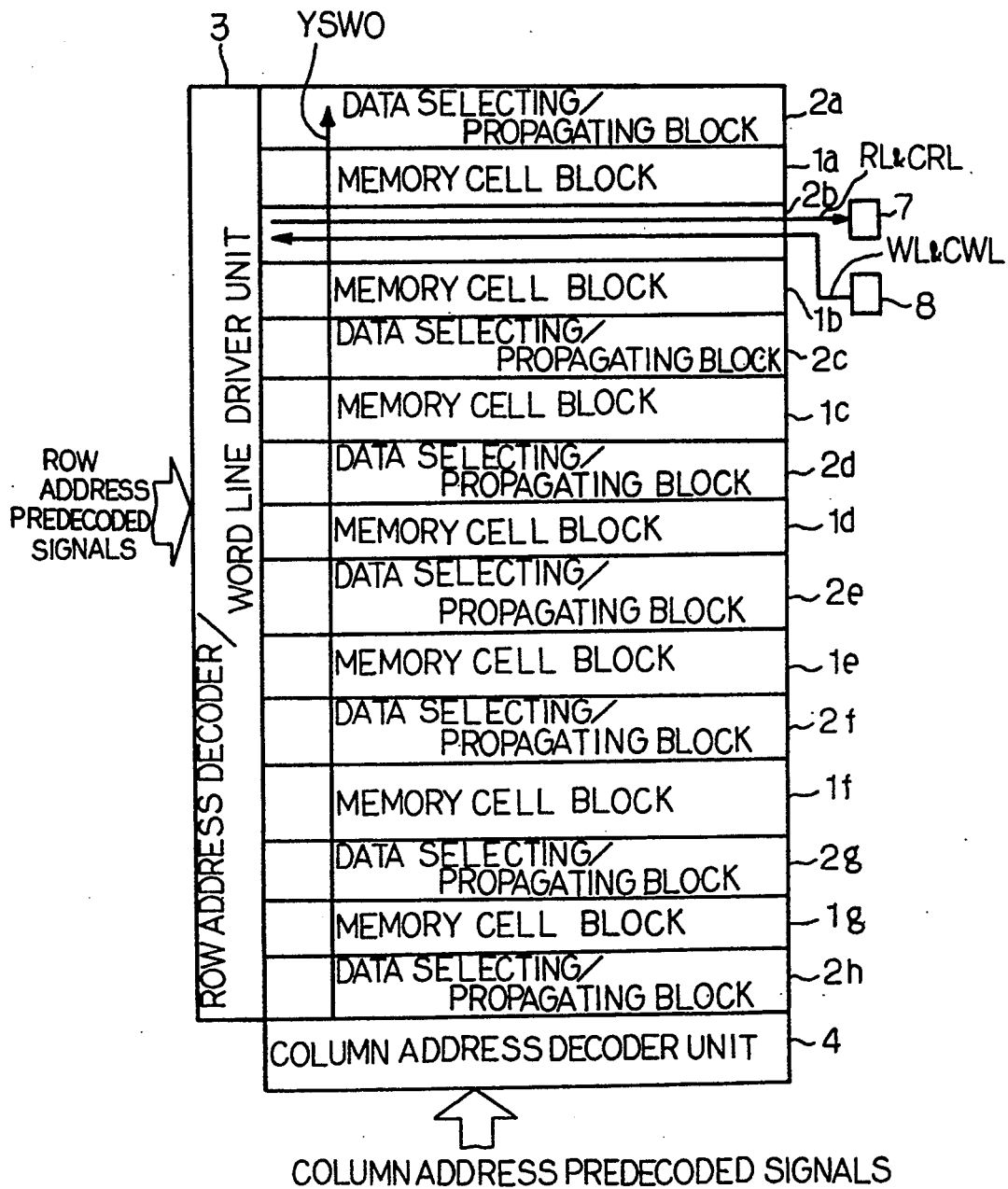
FIG. 1 is a block diagram showing the arrangement of the prior art dynamic random access memory device.
Figure 2:
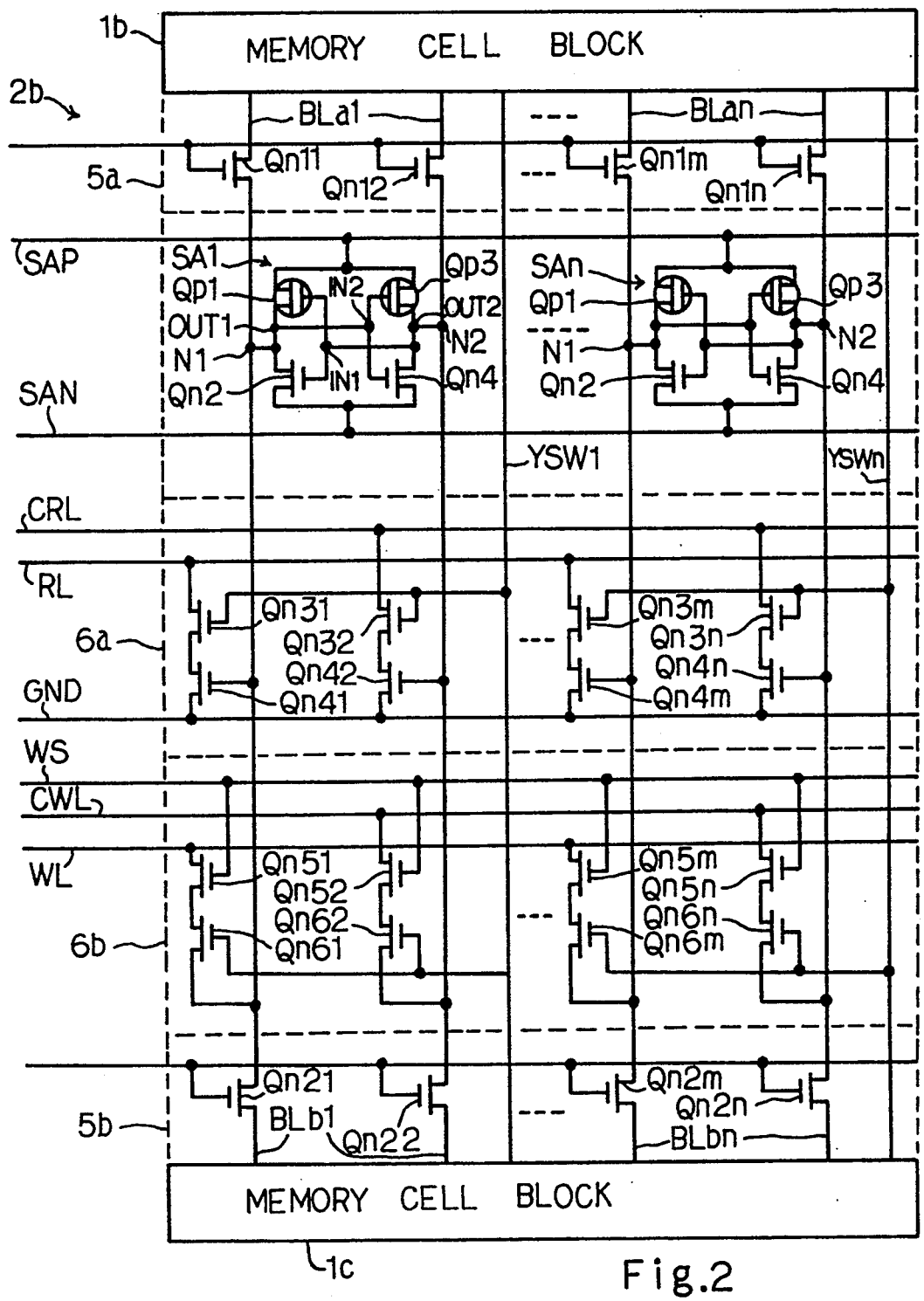
FIG. 2 is a circuit diagram showing the arrangement of one of the data selecting/propagating blocks incorporated in the prior art dynamic random access memory device.
Figure 3:
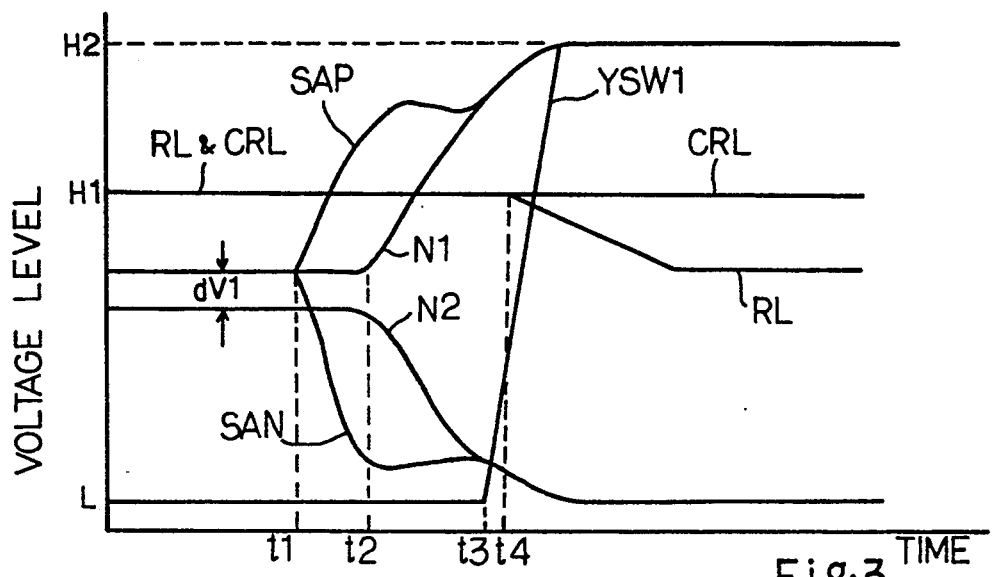
FIG. 3 is a graph showing the read-out sequence for the prior art dynamic random access memory device.
Figure 4:
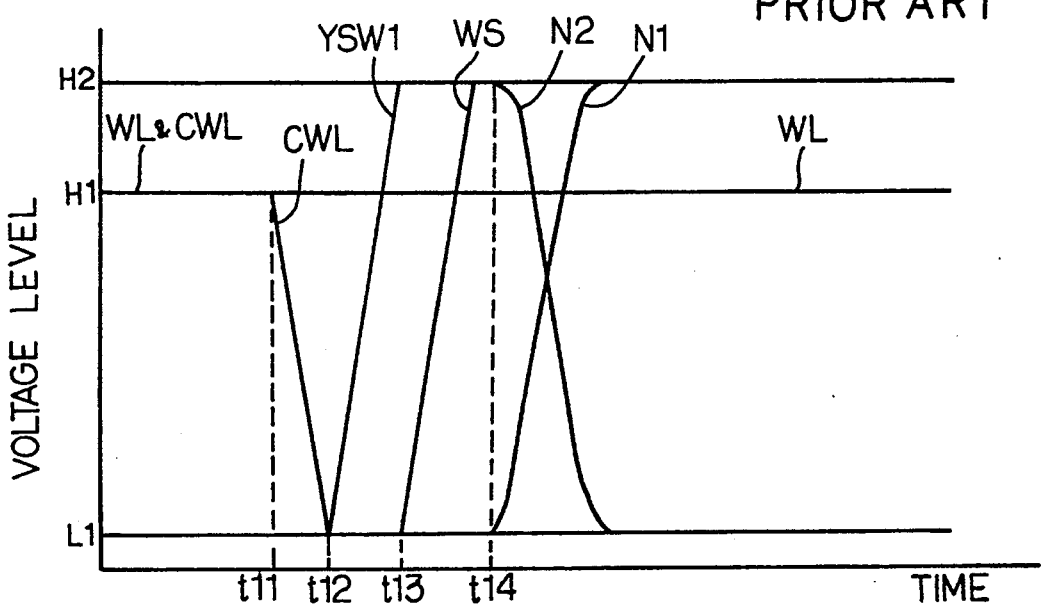
FIG. 4 is a graph showing the write-in sequence for the prior art dynamic random access memory device.
Figure 5:
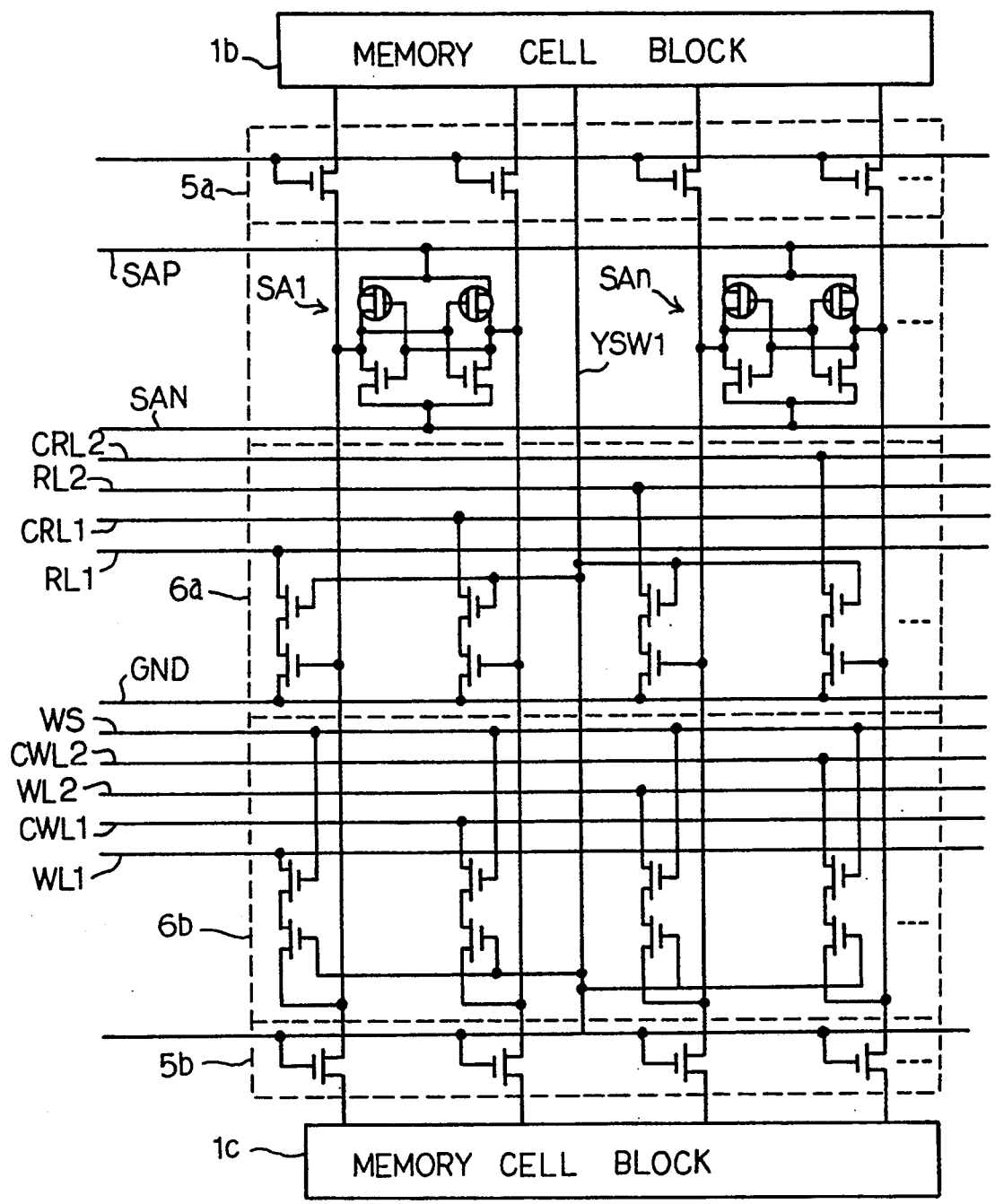
FIG. 5 is a circuit diagram showing the arrangement of the prior art data selecting/propagating blocks for concurrently selecting two data bits.
Figure 6:
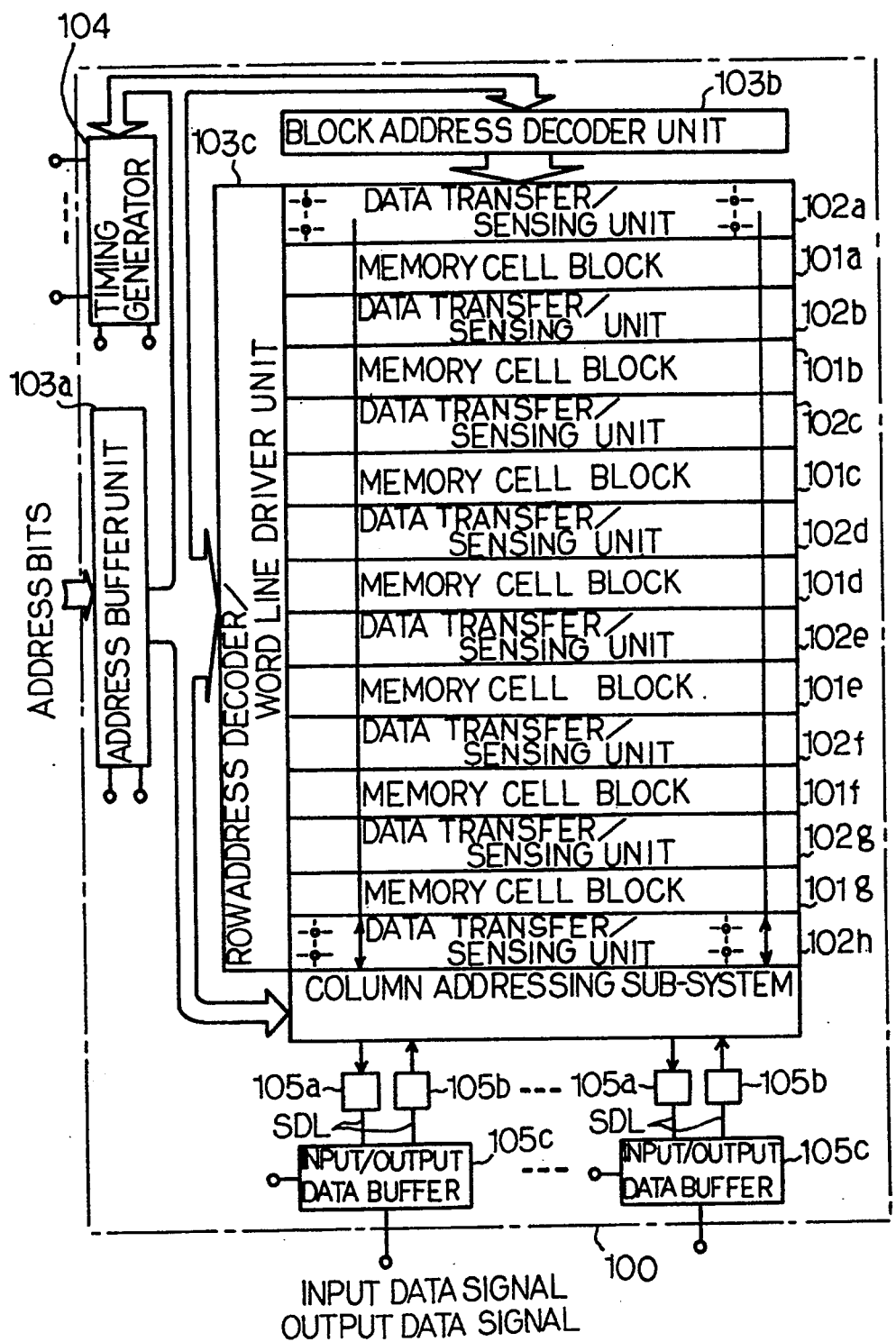
FIG. 6 is a block diagram showing the arrangement of a dynamic random access memory device according to the present invention.
Figure 7:
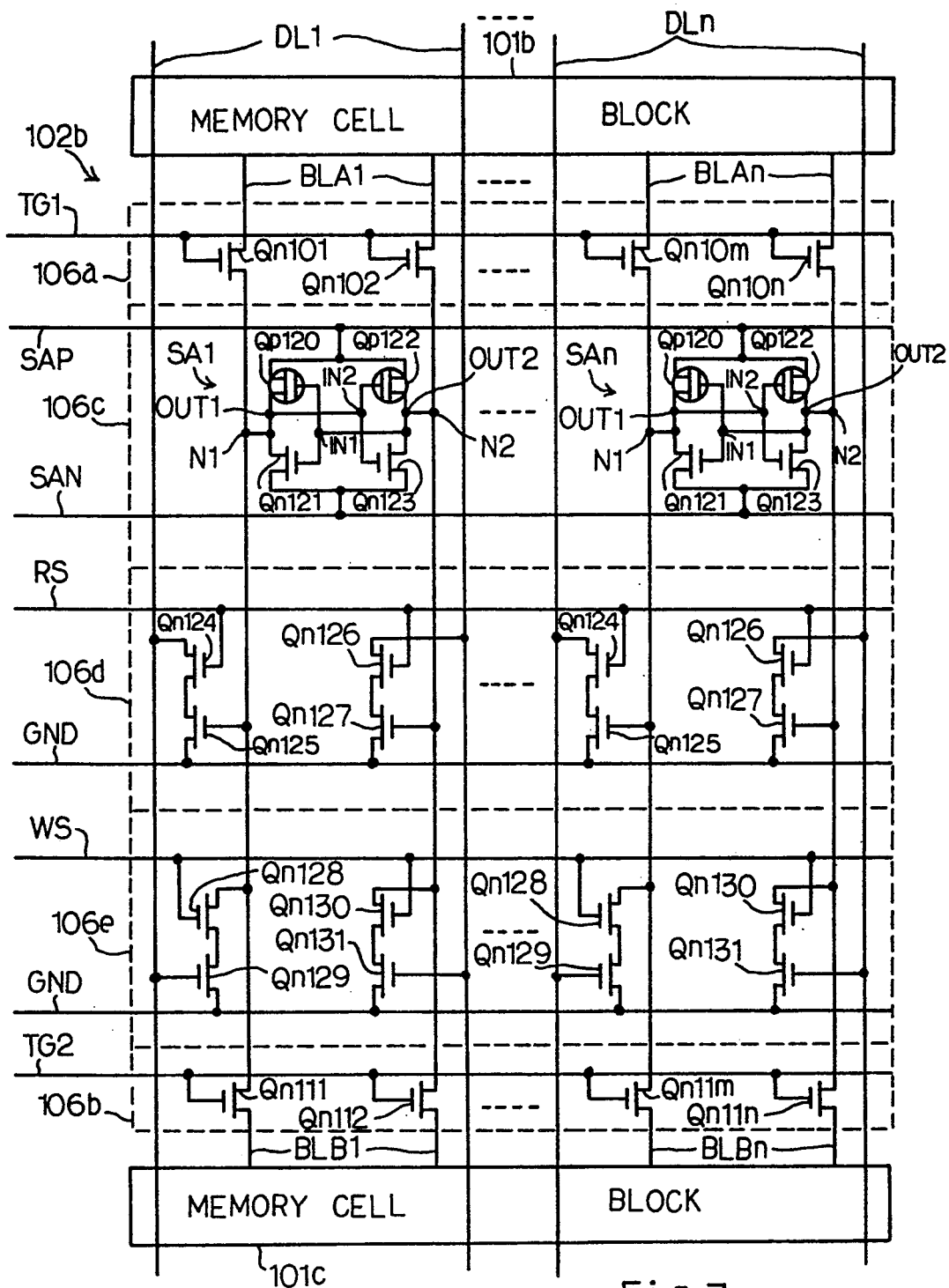
FIG. 7 is a circuit diagram showing the arrangement of a data transfer/sensing unit incorporated in the dynamic random access memory device according to the present invention.

Referring to FIG. 6 of the drawings, a dynamic random access memory device embodying the present invention is fabricated on a single semiconductor chip 100, and selectively enters a write-in mode, a read-out mode and a refreshing mode. The dynamic random access memory device comprises a plurality of memory cell blocks 101a, 101b, 101c, 101d, 101e, 101f and 101g and a plurality of data transfer and sensing units 101a, 102b, 102c, 102d, 102e, 102f, 102g and 102h interdigited with the plurality of memory cell blocks 101a to 101g. The memory cell blocks 101a to 101g are respectively assigned block addresses, and each of the memory cell blocks 101a to 101g is implemented by a plurality of memory cells arranged in rows and columns. In FIG. 6, some of the memory cells are represented by small bubbles. The memory cells are of a dynamic type, and stores data bits in the form of electric charges. Though not shown in FIG. 6, the memory cell blocks 101a to 101g are respectively associated with a plurality sets of word lines and with a plurality sets of bit line pairs. The rows of memory cells in each memory cell block are respectively coupled with word lines of the associated set, and a selected word line allows the associated row of memory cells to be accessible. The bit line pairs of each set are respectively coupled with the columns of memory cells, and propagate data bits in the form of potential difference from and to the selected row of memory cells. However, the arrangement of each memory cell block and the relation between the memory cell blocks 101a to 101g, the sets of word lines and the sets of bit line pairs are similar to those of the prior art, and no further description is incorporated hereinbelow.

The dynamic random access memory device further comprises an addressing system which is broken down into a block addressing sub-system, a row addressing sub-system and a column addressing sub-system. An address buffer unit 103a is shared between the three sub-systems, and temporally stores block address bits, row address bits and column address bits for producing block address predecoded signals, row address predecoded signals and column address predecoded signals.

The block addressing sub-system comprises a block address decoder unit 103b responsive to the block address predecoded signals for selectively enabling the memory cell blocks 101a to 101g. In this instance, the block address decoder unit 103b enables one of the memory cell blocks 101a to 101g. However, more than one memory cell block may be concurrently enabled by a block address decoder unit.

The row addressing sub-system has a row address decoder/word line driver unit 103c responsive to the row address predecoded signals, and selectively drives the word lines for selecting a row of memory cells from the enabled memory cell block.

The column addressing sub-system is shared between the data transfer/sensing units 102a to 102h and, accordingly, between the memory cell blocks 101a to 101g, and will be described hereinlater.

The dynamic random access memory device further comprises a timing generator 104, and the timing generator 104 is responsive to external control signals and the address bits for controlling a read-out sequence in the read-out mode, a write-in sequence in the write-in mode and a refreshing sequence in the refreshing mode with internal control signals. Description will refer to several internal control signals in connection with the arrangement of the data transfer/sensing units.

The dynamic random access memory device further comprises a data interface system which comprises a plurality of read amplifier circuits 105a, a plurality of write amplifier circuits 105b and a plurality of input-/output data buffer circuits 105c, and a multi-bit output data signal and a multi-bit input data signal are transferred between an external device and one of the memory cell blocks 101a to 101g. The multi-bit output data signal is indicative of a plurality of read-out data bits, and the multi-bit input data signal is indicative of write-in data bits. However, only one set of read amplifier circuit 105a, write amplifier circuit 105b and input/output data buffer circuit 105c is described hereinlater, because the other sets are analogous thereto.

A read-out data bit is amplified by the read amplifier circuit 105a in the read-out mode, and is, thereafter, transferred to the input/output data buffer circuit 105c. The input/output data buffer circuit 105c produces an output data signal from the read-out data bit, and the output data signal is supplied from the input/output data buffer circuit 105c to a destination. On the other hand, the write amplifier 105b is enabled in the write-in mode, and produces a potential difference from a write-in data bit temporally stored in the input/output data buffer circuit 105c.

Although other systems such as a power distribution system and a precharging system for the bit line pairs are further incorporated in the dynamic random access memory device, description on these systems is omitted, because they are less important for understanding the gist of the present invention.

The data transfer/sensing units 102a to 102h are similar in arrangement to one another, and the data transfer/sensing unit 102b is described in detail hereinbelow.

The data transfer/sensing unit 102b is available for the memory cell blocks 101b and 101c, and bit line pairs BLA1 to BLAn and BLBa to BLBn are respectively associated with the memory cell blocks 101b an 101c, respectively. Each set of bit line pairs is shared between two data transfer/sensing units on both sides thereof, and the bit line pairs are alternately terminated at the associated two data transfer/sensing units. The data transfer/sensing unit largely comprises a first transfer gate unit 106a, a second transfer gate unit 106b, a sense amplifier unit 106c, a third transfer gate unit 106d and a fourth transfer gate unit 106e, and is coupled between the bit line pairs BLA1 to BLAn and BLB1 to BLBn and a plurality of data line pairs DL1 to DLn. The plurality of data line pairs DL1 to DLn extend in parallel to the bit line pairs BLA1 to BLAn and BLB1 to BLBn, and both of the bit line pairs BLA1 to BLAn and BLB1 to BLBn and the data line pairs DL1 to DLn are formed in an inter-level insulating film structure provided on the major surface of the semiconductor chip 100. In general, the data transfer/sensing units 102a to 102h are wide enough to arrange not only the bit line pairs BLA1 to BLAn and BLB1 to BLBn but also the data line pairs DL1 to DLn, and, for this reason, any bit line or any data line does not overflow from the space over the area assigned to the data transfer/sensing units 102a to 102h. This means that the area assigned to the read-out data line pair RL/CRL and to the write-in data line pair WL/CWL is deleted from the semiconductor chip 100, and the semiconductor chip 100 is scaled down.

The first transfer gate array 106a is implemented by a plurality pairs of n-channel enhancement type transfer transistors Qn101/Qn102 to Qn10m/Qn10n, and the pairs of n-channel enhancement type transfer transistors Qn101/Qn102 to Qn10m/Qn10n are respectively coupled between the bit line pairs BLA1 to BLAn and the sense amplifier unit 106c. The n-channel enhancement type transfer transistors Qn101 to Qn10n are concurrently gated by an internal control signal line TG1 supplied from the timing generator 104, and the timing generator 104 shifts the internal control signal line TG1 to active high voltage level when the block address bits are indicative of the block address assigned to the memory cell block 101b.

Similarly, the second transfer gate array 106b is implemented by a plurality pairs of n-channel enhancement type transfer transistors Qn111/Qn112 to Qn11m/Qn11n, and the pairs of n-channel enhancement type transfer transistors Qn111/Qn112 to Qn11m/Qn11n are coupled between the bit line pairs BLB1 to BLBn and the sense amplifier unit 106c. The n-channel enhancement type transfer transistors Qn111 to Qn11n concurrently turn on and off by means of an internal control signal line TG2, and the timing generator 104 shifts the internal control signal line TG2 to the active high voltage level when the block address bits are indicative of the block address assigned to the memory cell block 101c. The internal control signals TG1 and TG2 are complementary to each other, and one of the first and second transfer gate units 106a and 106b couples the associated bit line pairs BLA1 to BLAn or BLB1 to BLBn with the sense amplifier unit 106c.

The sense amplifier unit 106c is constituted by a plurality of sense amplifier circuits SA1 to SAn shared between the memory cell blocks 101b and 101c, and one of the first and second transfer gate units 106a and 106b couples the associated bit line pairs BLA1 to BLAn or BLB1 to BLBn with the sense amplifier circuits SA1 to SAn. Each of the sense amplifier circuits SA1 to SAn is implemented by two complementary inverters, i.e., two series combinations of p-channel enhancement type switching transistors and n-channel enhancement type switching transistors Qp120/Qn121 and Qp122/Qn123 coupled between power supply lines SAP and SAN, and the input node IN1 or IN2 of one of the complementary inverters is coupled with the output node OUT2 or OUT1 of the other of the complementary inverters. The power supply lines SAP and SAN are driven to high power voltage level and low power voltage level by a power supplying circuit (not shown) under the control of the timing generator 104, and the sense amplifier circuits SA1 to SAn develop potential differences between nodes N1 and N2 selectively connectable with the first and second transfer gate units 106a and 106b.

The third transfer gate unit 106d comprises a plurality pairs of transfer circuits, and the plurality pairs of transfer circuits are respectively associated with the sense amplifier circuits SA1 to SAn and with the plurality of data line pairs DL1 to DLn. Each pair of transfer circuits is implemented by a two series combinations of n-channel enhancement type switching transistors Qn124/Qn125 and Qn126/Qn127 coupled between the associated data line pair and a ground voltage line GND, and all of the n-channel enhancement type switching transistors Qn124 and Qn126 are concurrently gated by an internal control signal line RS for a read enable signal. The read enable signal is one of the internal control signals, and the timing generator 104 produces the read enable signal at an appropriate timing in the read-out mode. On the other hand, the n-channel enhancement type switching transistors Qn125 and Qn127 are gated by the nodes N1 and N2 of the associated sense amplifier circuits SA1 to SAn, and data lines are selectively grounded through the series combinations of n-channel enhancement type switching transistors Qn124/Qn125 and/or Qn126/Qn127.

The fourth transfer gate unit 106e also comprises a plurality pairs of transfer circuits, and the plurality pairs of transfer circuits are respectively associated with the plurality of data line pairs DL1 to DLn and with the sense amplifier circuits SA1 to SAn. Each pair of transfer circuits is implemented by a two series combinations of n-channel enhancement type switching transistors Qn128/Qn129 and Qn130/Qn131 coupled between the associated nodes N1 and N2 and the ground voltage line GND, and all of the n-channel enhancement type switching transistors Qn128 and Qn130 are concurrently gated by an internal control signal line WS for a write enable signal. The write enable signal is one of the internal control signals, and the timing generator 104 produces the write enable signal at an appropriate timing in the write-in mode. On the other hand, the n-channel enhancement type switching transistors Qn129 and Qn131 are gated by the associated data lines of the data line pair, and the nodes N1 and N2 are selectively grounded through the series combinations of n-channel enhancement type switching transistors Qn128/Qn129 and/or Qn130/Qn131.

Figure 8:
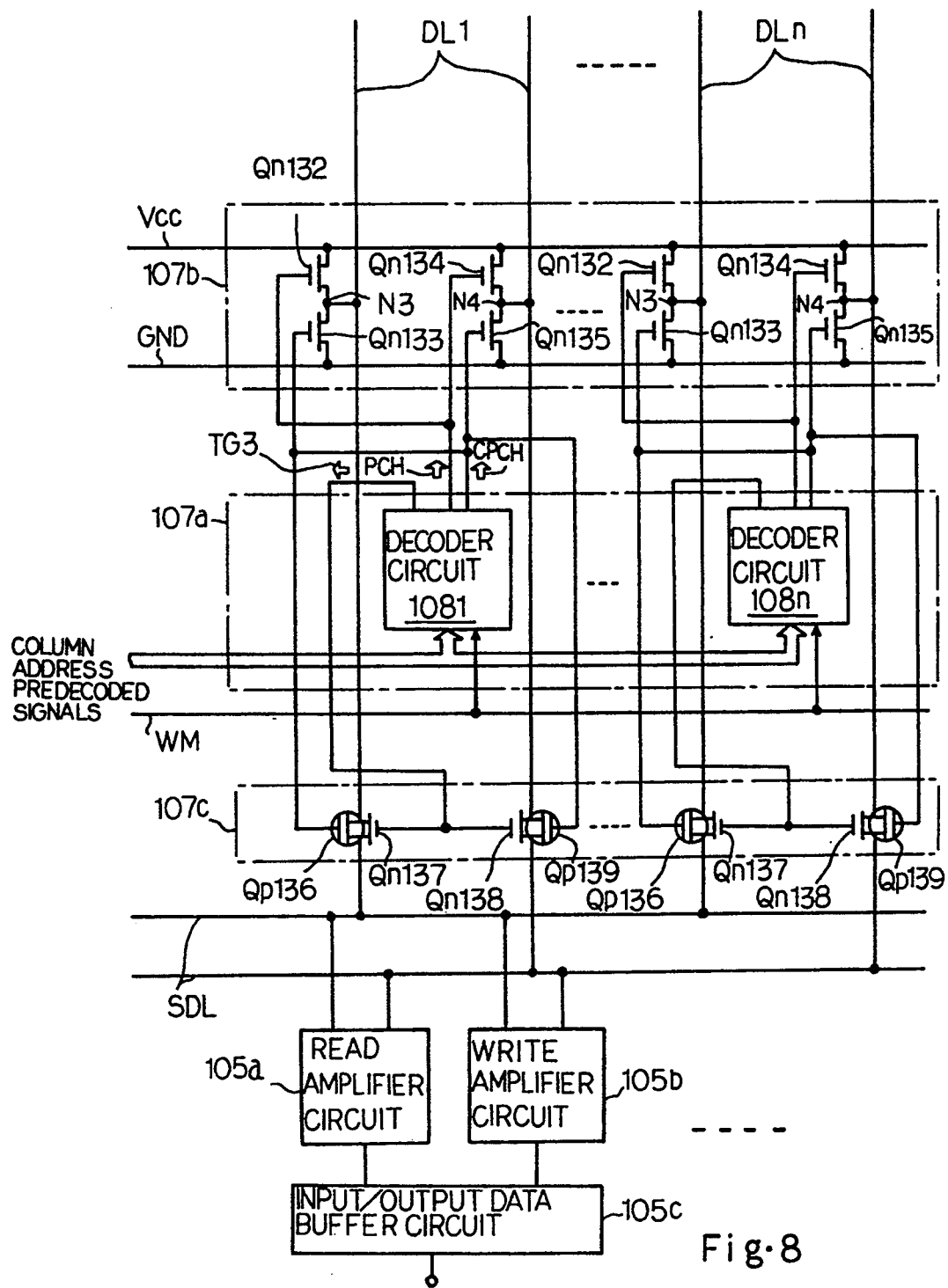
FIG. 8 is a circuit diagram showing the arrangement of a column addressing sub-system incorporated in the dynamic random access memory device according to the present invention.

Turning to FIG. 8 of the drawings, the column addressing sub-system comprises a column address decoder unit 107a, a precharging unit 107b for the data line pairs DL1 to DLn and a column selector unit 107c, and serves as a column selecting and precharging means.

The column address decoder unit 107a is constituted by a plurality of decoder circuits 1081 to 108n respectively associated with the data line pairs DL1 to DLn, and the plurality of decoder circuits 1081 to 108n are responsive to the column address predecoded signals for controlling the precharging unit 107b and the column selector unit 107c. Namely, the column address predecoded signals are indicative of column addresses assigned to selected data line pairs DL1 to DLn and, accordingly, to selected sense amplifier circuits SA1 to SAn, and the associated decoder circuits selected from 1081 to 108n produce a precharge control signal PCH of active high voltage level, the complementary precharge control signal CPCH and a gate control signal TG3 of the active high voltage level. However, a disable signal WM is supplied from the timing generator 104 to the column address decoder unit 107a at an appropriate timing in the write-in mode, and causes the column address decoder unit 107a to keep the precharge control signal PCH in the inactive low voltage level regardless of the column address predecoded signals.

Figure 9:
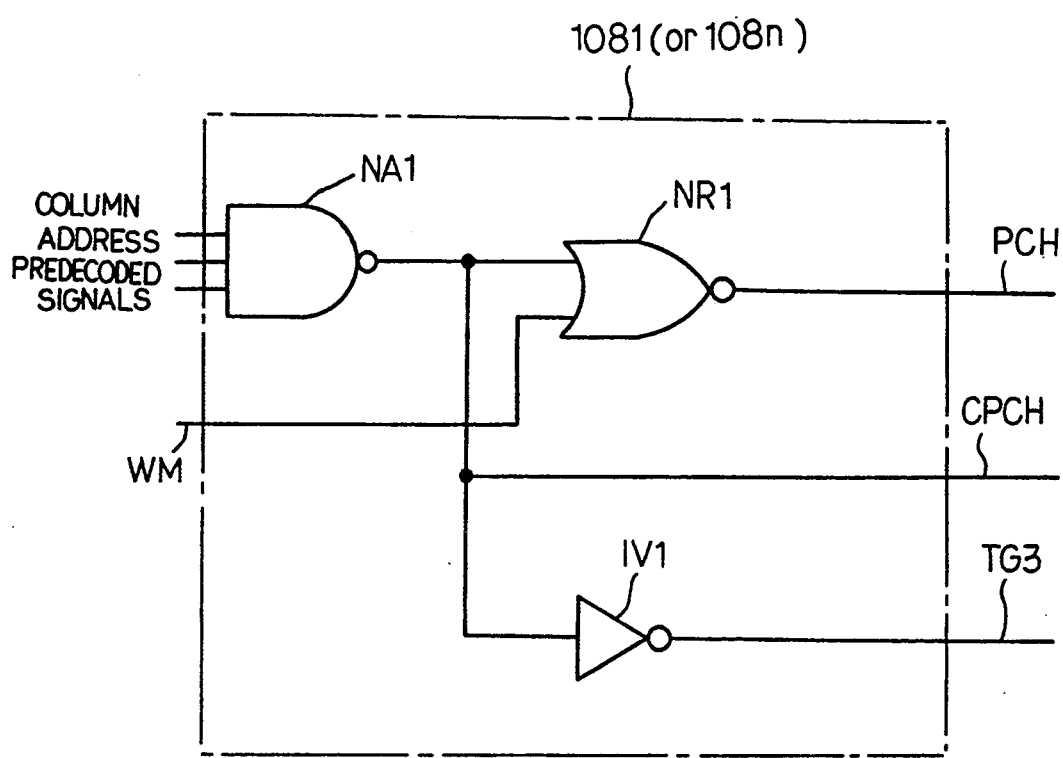
FIG. 9 is a logic diagram showing a decoder circuit incorporated in the dynamic random access memory device according to the present invention.

As will be seen from FIG. 9 of the drawings, each of the decoder circuits 1081 to 108n comprises a NAND gate NA1, a NOR gate NR1 and an inverter IV1, and selected column address predecoded signals are supplied to the NAND gate NA1. If all of the selected column address predecoded signals are logic "1" level corresponding to the high voltage level, the NAND gate acknowledges that the associated data line pair is selected, and supplies the complementary precharge control signal of logic "0" level to the NOR gate NR1 and the inverter IV1. The disable signal WM remains low in the read-out mode, and the NOR gate NR1 and the inverter shift the precharge control signal PCH and the gate control signal TG3 to the active high voltage level, respectively. On the other hand, the disable signal WM goes up to the high voltage level in the write-in mode, and the NOR gate NR1 keeps the precharge control signal PCH inactive low. However, the inverter IV1 shifts the gate control signal TG3 to the active high voltage level regardless of the disable signal WM.

Turning back to FIG. 8, the precharge control signal PCH and the complementary precharging control signal CPCH are supplied to the precharging unit 107b for selectively charging the data line pairs DL1 to DLn. The gate control signal TG3 is supplied to the column selector unit 107c together with the complementary precharge control signal CPCH, and causes the column selector unit 107c to couple the selected data line pairs DL1 to DLn with a plurality of sub-data line pairs SDL. Each of the sub-data line pairs SDL is shared between one of the pairs of read amplifier circuit 105 and write amplifier circuit 105b, and propagates a potential difference indicative of one of the read-out data bits and a potential difference indicative of one of the write-in data bits between a selected data line pair and the read-/write amplifier circuits 105a and 105b.

The precharging unit 107b is implemented by series combinations of n-channel enhancement type switching transistors Qn132/Qn133 and Qn134/Qn135 coupled in parallel between a positive power voltage line Vcc and the ground voltage line GND, and the common drain nodes N3 and N4 are coupled with the data line pairs DL1 to DLn. Every two series combinations of n-channel enhancement type switching transistors Qn132/Qn133 and Qn134/Qn135 are associated with the data line pairs DL1 to DLn and with the decoder circuits 1081 to 108n, and the precharge control signal PCH and the complementary precharge control signal CPCH are supplied from the selected decoder circuit to the n-channel enhancement type switching transistors Qn132/Qn134 and the n-channel enhancement type switching transistors Qn133/Qn135 for the associated bit line pair. For this reason, the data line pairs Dl1 to DLn are selectively precharged to a high voltage level lower than the positive power voltage level Vcc by the threshold of the n-channel enhancement type switching transistors Qn132 and Qn134, and the other data line pairs are maintained at the ground voltage level. This feature is desirable for reduction in electric power, because all of the third transfer gate unit 106d provides current paths between all the data line pairs DL1 to DLn and the ground voltage line GND.

The column selector unit 107c is constituted by a plurality sets of column selector circuits each implemented by a plurality pairs of transfer transistors, and each of the transfer transistors is implemented by a parallel combination of a p-channel enhancement type switching transistor Qp136/Qp139 and an n-channel enhancement type switching transistor Qn137/Qn138. Although the plurality sets of column selector circuits are respectively associated with the sub-data line pairs SDL, only one column selector circuit is illustrated in FIG. 8, and description is made on the column selector circuit for the sake of simplicity.

The plurality pairs of transfer transistors are coupled between the data line pairs DL1 to DLn and the associated sub-data line pair SDL, and one pair of transfer transistors couples the associated data line pair with the sub-data line pair SDL. Namely, the p-channel enhancement type switching transistors Qp136 and Qp139 are gated with the complementary precharge control signal CPCH, and the n-channel enhancement type switching transistors Qn137 and Qn138 are gated with the gate control signal TG3. As described hereinbefore, only one of the decoder circuits 1081 to 108n produces the gate control signal TG3 and the complementary precharge control signal CPCH, and the associated pair of transfer transistors couples the selected data line pair with the sub-data line pair SDL.

Figure 10:
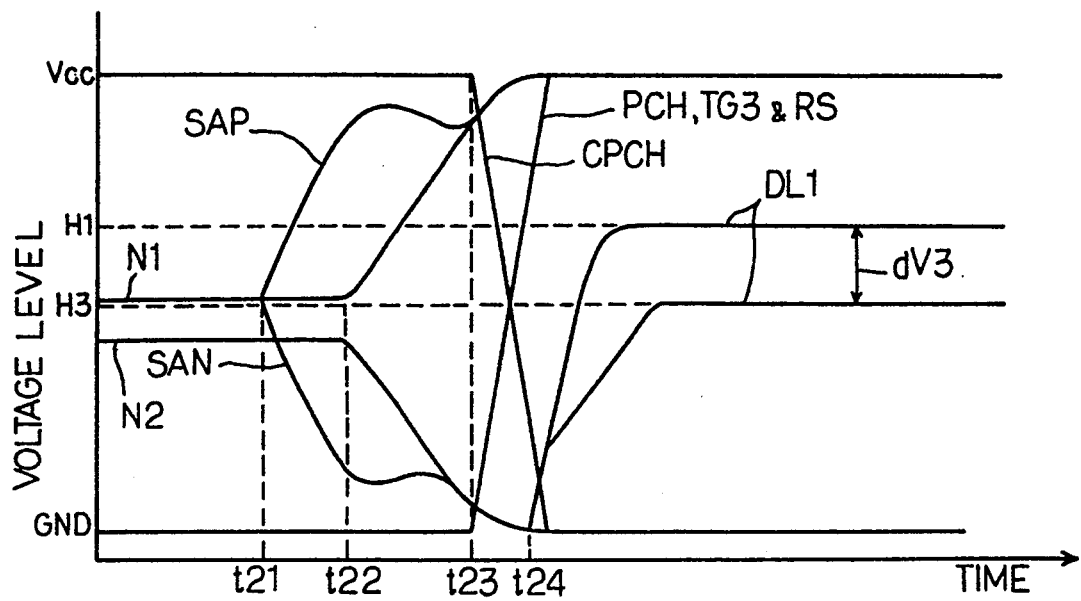
FIG. 10 is a graph showing a read-out sequence for the dynamic random access memory device according to the present invention.
Figure 11:
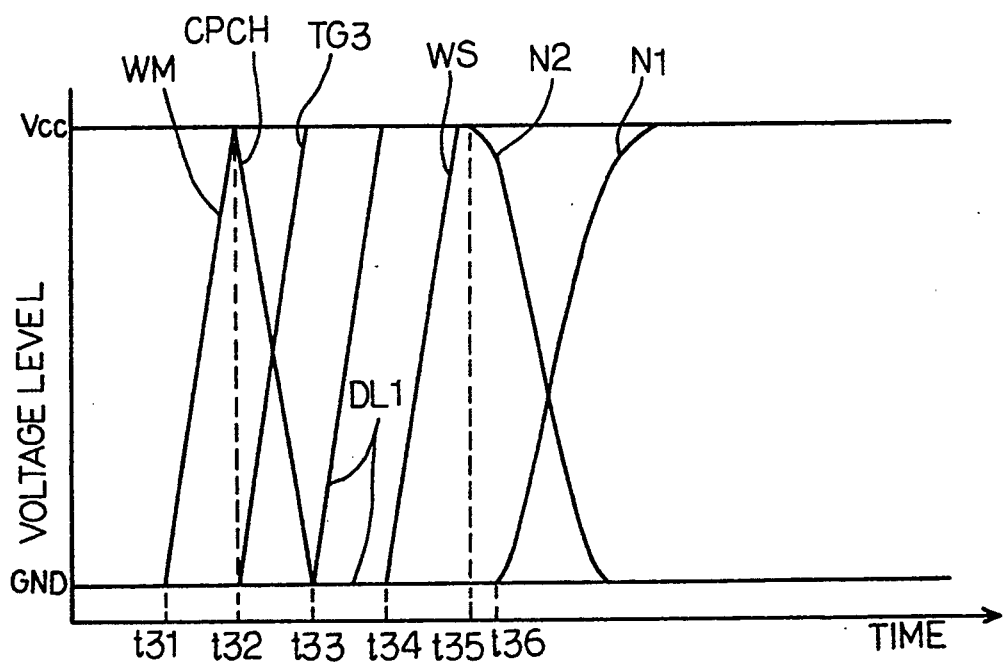
FIG. 11 is a graph showing a write-in sequence for the dynamic random access memory device according to the present invention.

Description is hereinbelow made on the read-out sequence and the write-in sequence with reference to FIGS. 10 and 11, and the read-out sequence and the write-in sequence are focused upon the data line pair DL1 and the sense amplifier circuit SA1 on the assumption that the column address predecoded signals are indicative of the column addresses including the column address assigned to the bit line pair BLA1.

Assuming now that the dynamic random access memory device enters the read-out mode, the read-out sequence starts with supply of the address bits, and the timing generator sequentially produces the internal control signals. The block address decoder unit 103b enables the memory cell block 101b, and the row address decoder/word line driver unit 103c selects one of the rows of memory cells. Then, small potential differences take place on the bit line pairs BLA1 to BLAn, and the gate control signal TG1 of the active high voltage level transfers the small potential differences to the sense amplifier circuits SA1 to SAn. The power voltage line SAP goes up to the positive power voltage level at time t21, and the power voltage line SAN concurrently goes down to the ground voltage level. Then, the sense amplifier circuits SA1 to SAN are powered for developing the small potential differences.

The sense amplifier circuit SA1 starts increasing the small potential difference in magnitude at time t22, and the decoder circuit 1081 shifts the precharge control signal PCH and the gate control signal TG3 to the active high voltage level and the complementary precharge control signal CPCH to the low voltage level at time t23. However, the other decoder circuits keeps the precharge control signals PCH at the inactive low voltage level and the complementary precharge control signal CPCH at the high voltage level. As a result, current flows from the positive power voltage line Vcc to only the data line pair DL1, and other data line pairs are discharged.

The gate control signal TG3 and the complementary precharge control signal CPCH cause the column selector unit 107c to couple the data line pair DL1 with one of the sub-data line pairs SDL.

The read enable signal RS concurrently starts going up at time t23, and all of the n-channel enhancement type switching transistors Qn124 and Qn126 turn on. The potential difference developed by the sense amplifier circuit SA1 are supplied to the n-channel enhancement type switching transistors Qn125 and Qn127 associated with the sense amplifier circuit SA1, and allows the n-channel enhancement type switching transistors Qn125 and Qn127 to complementarily turn on and off. As a result, one of the pair of data lines DL1 is coupled through the sense amplifier circuit SA1 with the power voltage line GND, and the other data line is isolated from the sense amplifier circuit SA1 by means of the third transfer gate unit 106d. For this reason, one of the data lines is saturated at the positive high voltage level H1 lower than the power voltage level Vcc by the threshold of the n-channel enhancement type switching transistor Qn132 or Qn134, and the other data line is saturated at a positive voltage level H3 lower than the positive high voltage level H1. Thus, the potential difference between the nodes N1 an N2 of the sense amplifier circuit SA1 is transferred to a potential difference dV3 on the data line pair DL1, and the potential difference dV3 in turn is transferred from the data line pair DL1 through the column selector unit 107c to the sub-data line pair SDL.

The potential difference dV3 is increased in magnitude by the read amplifier circuit 105a, and the read amplifier circuit 105a produces the output data signal indicative of the data bit read out to the bit line pair BLA1.

While the dynamic random access memory device is staying in the write-in mode, the address bits is changed, and the write-in sequence starts. The timing generator 104 starts the disable signal WM rising toward the high voltage level at time t31, and the decoder circuit 1081 changes the gate control signal TG3 and the complementary precharge control signal CPCH toward the high voltage level and low voltage level at time t32. However, the precharge control signal PCH is fixed to the low voltage level in the presence of the disable signal WM. As a result, the data line pair DL1 is isolated from the ground voltage line GND and the power voltage line Vcc by means of the precharging unit 107b, and the column selector unit 107c couples one of the sub-data line pairs SDL with the data line pair DL1.

When an input data signal is supplied from the input-/output data buffer circuit 105c to the write amplifier circuit 105b, the write amplifier circuit 105b drives one of the sub-data lines to the high voltage level and the other sub-data line to the low voltage level. Since the column selector unit 107c couples the sub-data line pair SDL with the data line pair DL1, one of the data lines DL1 goes up toward the high voltage level at time t33, and the other data line is maintained at the low voltage level. As a result, potential difference indicative of the write-in data bit takes place on the data line pair DL1.

The write enable signal WS goes up toward the high voltage level at time t34, and the n-channel enhancement type switching transistors Qn128 and Qn130 turn on. The potential difference on the data line pair DL1 causes the n-channel enhancement type switching transistors Qn129 and Qn131 associated with the sense amplifier circuit SA1 to complementarily turn on and off, and the nodes N2 and N1 of the sense amplifier circuit SA1 start decaying and rising at time t35 and t36, respectively.

The gate control signal TG1 has already allowed the first transfer gate unit 106a to couple the sense amplifier circuits SA1 to SAn with the bit line pairs BLA1 to BLAn, respectively. Then, one of the memory cells in the selected row stores the write-in data bit indicated by the potential difference between the nodes N1 and N2 of the sense amplifier circuit SA1.

As will be appreciated from the foregoing description, the dynamic random access memory device according to the present invention is fabricated on the small semiconductor chip 100 by virtue of the data line pairs DL1 to DLn arranged in parallel to the bit line pairs BLA1 to BLAn and BLB1 to BLBn, and the data line pairs DL1 to DLn are shared between the read amplifier circuit 105a and the write amplifier circuit 105b further decreases the amount of area occupied by the data lines.

Second Embodiment

Figure 12:
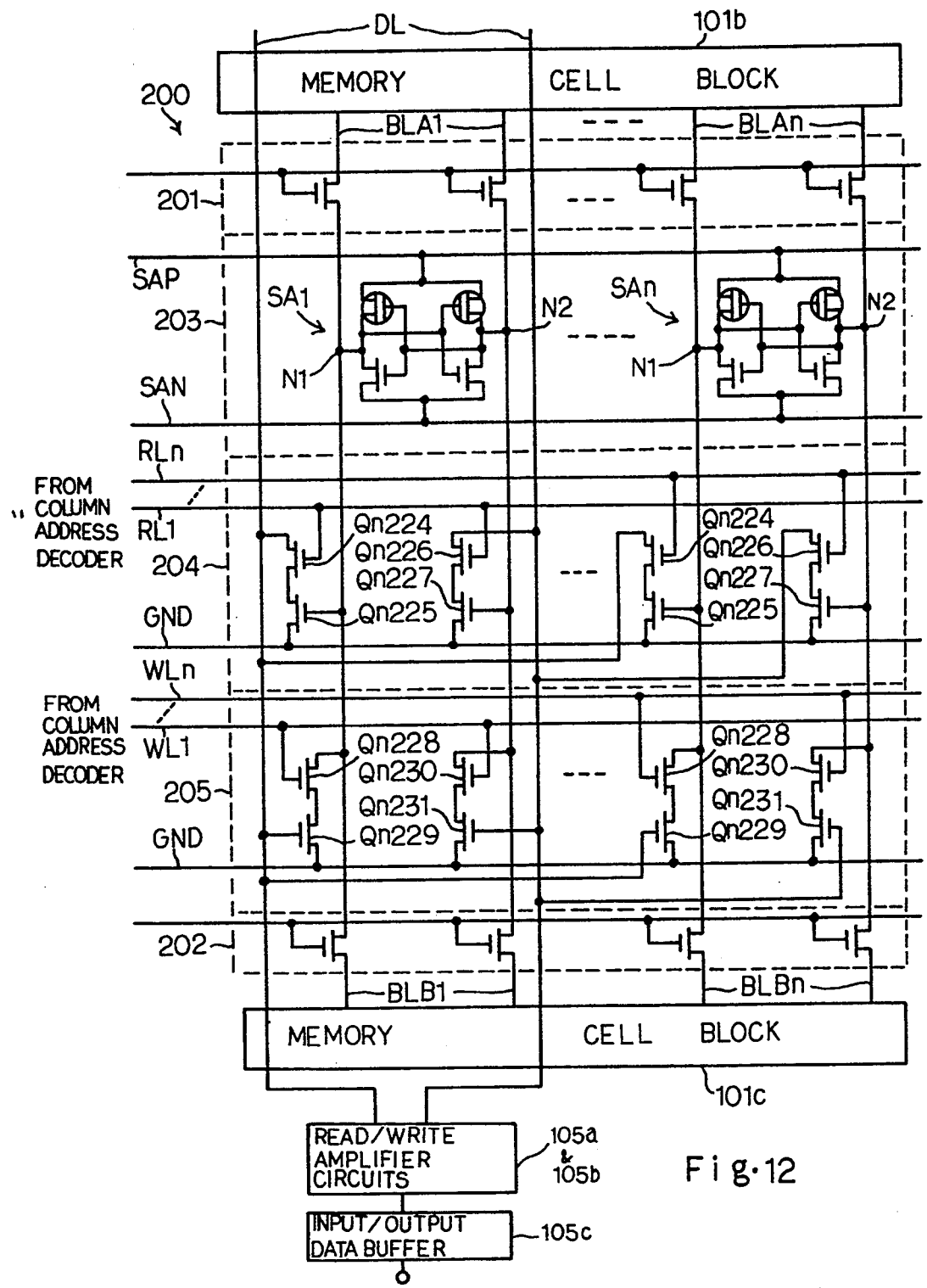
FIG. 12 is a circuit diagram showing the arrangement of a column addressing sub-system incorporated in another dynamic random access memory device according to the present invention.

Turning to FIG. 12 of the drawings, a data transfer/sensing unit 200 incorporated in another dynamic random access memory device embodying the present invention is associated with two memory cell blocks 101b and 101c, and the data transfer/sensing unit 200 and the memory cell blocks 101b and 101c form parts of the arrangement similar to that shown in FIG. 6. The data transfer/sensing unit 200 comprises a first transfer gate unit 201, a second transfer gate unit 202, a sense amplifier unit 203, a third transfer gate unit 204 and a fourth transfer gate unit 205, and the first transfer gate unit 201, the second transfer gate unit 202 and the sense amplifier unit 203 are similar to the first transfer gate unit 106a, the second transfer gate unit 106b and the sense amplifier unit 106c, respectively. For this reason, detailed description thereon is not incorporated hereinbelow for avoiding repetition.

Only one data line pair DL is provided for all of the data transfer/sensing units including the data transfer/sensing unit 200, and a plurality of read column selecting lines RL1 to RLn and a plurality of write column selecting lines WL1 to WLn are respectively provided for the third and fourth transfer gate units 204 and 205.

The third transfer gate unit 204 comprises a plurality pairs of transfer circuits coupled with the data line pair DL, and the plurality pairs of transfer circuits are respectively associated with the sense amplifier circuits SA1 to SAn. The plurality pairs of transfer circuits are selectively enabled for transferring a potential difference between the nodes N1 and N2 of one of the sense amplifier circuits SA1 to SAn to the data line pair DL.

Each pair of transfer circuits is implemented by a two series combinations of n-channel enhancement type switching transistors Qn224/Qn225 and Qn226/Qn227 coupled between the data line pair DL and the ground voltage line GND, and the n-channel enhancement type switching transistors Qn224 and Qn226 are selectively gated by the read column selecting line RL1 to RLn. The read column selecting lines RL1 to RLn are selectively driven by a column address decoder (now shown) in the read-out mode on the basis of the column address predecoded signals indicative of the column address assigned to one of the bit line pairs BLA1 to BLAn or BLB1 to BLBn. On the other hand, the n-channel enhancement type switching transistors Qn225 and Qn227 are gated by the nodes N1 and N2 of the associated sense amplifier circuits SA1 to SAn, and the data lines DL are selectively grounded through the series combinations of n-channel enhancement type switching transistors Qn224/Qn225 or Qn226/Qn227 of the enabled or selected pair of transfer circuits. As a result, a potential difference takes place on the data line pair DL, and the potential difference in the selected sense amplifier circuit is transferred through the third transfer gate unit to the data line pair DL.

The fourth transfer gate unit 205 also comprises a plurality pairs of transfer circuits, and the plurality pairs of transfer circuits are respectively associated with the sense amplifier circuits SA1 to SAn. The plurality pairs of transfer circuits are selectively enabled for transferring a potential difference on the data line pair to the nodes N1 and N2 of one of the sense amplifier circuits SA1 to SAn.

Each pair of transfer circuits is implemented by a two series combinations of n-channel enhancement type switching transistors Qn228/Qn229 and Qn230/Qn231 coupled between the associated nodes N1 and N2 and the ground voltage line GND, and the n-channel enhancement type switching transistors Qn228 and Qn230 are selectively gated by the write column selecting lines WL1 to WLn. The column address decoder selectively drives the write column selecting lines at an appropriate timing in the write-in mode. On the other hand, the n-channel enhancement type switching transistors Qn229 and Qn231 are gated by the data lines DL, and the nodes N1 and N2 of one of the sense amplifier circuits SA1 to SAn are selectively grounded through the series combinations of n-channel enhancement type switching transistors Qn128/Qn129 or Qn130/Qn131. As a result, the potential difference indicative of a write-in data bit is transferred through the fourth gate control unit 205 to the selected sense amplifier circuit.

The circuit behavior is analogous to that of the first embodiment. If the write enable signal WS in FIG. 11 is replaced with the selected write enable signal of the second embodiment by way of example, FIG. 11 illustrates the circuit behavior of the second embodiment.

The dynamic random access memory device implementing the second embodying achieves the advantages as similar to the first embodiment. Moreover, the dynamic random access memory device implementing the second embodiment is improved in access speed. In detail, an ordinary data line pair of a dynamic random access memory device is associated with 256 to 1024 sense amplifier circuits. However, the data line pair incorporated in the second embodiment is available for only 16 to 64 sense amplifier circuits, and the data line pair is driven at high speed, because the parasitic capacitance coupled with the data line pair is decreased.

Although particular embodiments of the present invention have been shown and described, it will be obvious to those skilled in the art that various changes and modifications may be made without departing from the spirit and scope of the present invention. For example, the dynamic random access memory device may be integrated on a semiconductor chip together with other function blocks. Another dynamic random access memory device may be equipped with only one pair of sub-data lines coupled with read/write amplifiers for producing a single-bit output data signal and a potential difference indicative of a single-bit input data signal. Moreover, the dynamic random access memory device implementing the second embodiment may be modified for allowing a plurality of data bits to be transferred between a plurality of data line pairs and selected sense amplifier circuits.

What is claimed is:

1. A semiconductor memory device fabricated on a single semiconductor chip, comprising:
   a) a plurality of memory cell blocks each implemented by a plurality of memory cells arranged in rows and columns;
   b) a plurality sets of bit line pairs each associated with said plurality of memory cell blocks, and each having a plurality of bit line pairs respectively coupled with the columns of memory cells of the associated memory cell block;
   c) a row selecting system associated with said plurality of memory cell blocks, and selectively allowing said plurality of memory cell blocks to transfer data bits from and to the associated bit line pairs;
   d) a plurality of data transferring and sensing units each available for two memory cell blocks selected from said plurality of memory cell blocks, each of said plurality of data transferring and sensing units comprising
      d-1) a plurality of sense amplifier circuits for amplifying potential differences indicative of data bits, respectively,
      d-2) a first transfer gate unit coupled between the plurality of bit line pairs associated with one of said two memory cell blocks and said plurality of sense amplifier circuits, and responsive to a first transfer signal for transferring said potential differences between said plurality of bit line pairs and said plurality of sense amplifier circuits,
      d-3) a second transfer gate unit coupled between the plurality of bit line pairs associated with the other of said two memory cell blocks and said plurality of sense amplifier circuits, and responsive to a second transfer signal complementary to said first transfer signal for transferring said potential differences between said plurality of bit line pairs and said plurality of sense amplifier circuits,
      d-4) a third transfer gate unit coupled with said plurality of sense amplifier circuits, and responsive to a read enable signal for entering on-state, and
      d-5) a fourth transfer gate unit coupled with said plurality of sense amplifier circuits, and responsive to a write enable signal for entering on-state;
   e) a plurality of data line pairs arranged in parallel to said plurality of bit line pairs, and coupled with both third and fourth transfer gate units;
   f) a read/write amplifier unit operative to produce an output data signal from a potential difference indicative of one of said data bits and a new potential difference from an input data signal; and
   g) a column selecting and precharging means coupled between said read/write amplifier unit and said plurality of data line pairs, and operative to coupled one of said plurality of data line pairs and to charge said one of said plurality of data line pairs for producing said potential difference indicative of one of said data bits and said new potential difference thereon.

2. A semiconductor memory device as set forth in claim 1, in which said third transfer gate unit comprises a plurality pairs of first transfer circuits respectively associated with said plurality of sense amplifier circuits and with said plurality of data line pairs, each pair of first transfer circuits comprising a series combination of a first switching transistor and a second switching transistor coupled between a first data line of the associated data line pair and a constant voltage line and a series combination of a third switching transistor and a fourth switching transistor coupled between a second data line of said associated data line pair and said constant voltage line, said first and third switching transistors of each pair of first transfer circuits concurrently turning on in the presence of said read enable signal, the potential difference of the associated sense amplifier circuit being supplied to the gate electrodes of said second and fourth switching transistors for complementarily changing said second and fourth switching transistors between on-state and off-state.

3. A semiconductor memory device as set forth in claim 2, in which said fourth transfer gate unit comprising a plurality pairs of second transfer circuits respectively associated with said plurality of data line pairs and with said plurality of sense amplifier circuits, each pair of second transfer circuits comprising a series combination of a fifth switching transistor and a sixth switching transistor coupled between a first node of the associated sense amplifier circuit and said constant voltage line and a series combination of a seventh switching transistor and an eighth switching transistor coupled between a node of said associated sense amplifier circuit and said constant voltage line, said fifth and seventh switching transistors of each pair of second transfer circuits concurrently turning on in the presence of said write enable signal, the potential difference on the associated data line pair being supplied to the gate electrodes of said sixth and eighth switching transistors for complementarily changing said sixth and eighth switching transistors between on-state and off-state.

4. A semiconductor memory device as set forth in claim 3, in which said column selecting and precharging means comprises g-1) a plurality of decoder circuits respectively associated with said plurality of data line pairs, and responsive to column address signals so that one of said plurality of decoder circuits produces a precharge control signal and a third gate control signal, g-2) a plurality of precharging circuits respectively associated with said plurality of data line pairs and with said plurality of decoder circuits, and responsive to said precharge control signal so that one of said plurality of precharging circuits charges the associated data line to a precharging level, the others of said plurality of precharging circuits keeping the associated data line pairs in discharged state, and g-3) a fifth transfer gate unit coupled between said plurality of data line pairs and said read/write amplifier unit, and responsive to said third gate control signal so that one of said plurality of data line pairs is coupled with said read/write amplifier unit.

5. A semiconductor memory device fabricated on a single semiconductor chip, comprising:

a) a plurality of memory cell blocks each implemented by a plurality of memory cells arranged in rows and columns;

b) a plurality sets of bit line pairs each associated with said plurality of memory cell blocks, and each having a plurality of bit line pairs respectively coupled with the columns of memory cells of the associated memory cell block;

c) a row selecting system associated with said plurality of memory cell blocks, and selectively allowing said plurality of memory cell blocks to transfer data bits from and to the associated bit line pairs;

d) a plurality of data transferring and sensing units each available for two memory cell blocks selected from said plurality of memory cell blocks, each of said Plurality of data transferring and sensing units comprising d-1) a plurality of sense amplifier circuits for amplifying potential differences indicative of data bits, respectively, d-2) a first transfer gate unit coupled between the plurality of bit line pairs associated with one of said two memory cell blocks and said plurality of sense amplifier circuits, and responsive to a first transfer signal for transferring said potential differences between said plurality of bit line pairs and said plurality of sense amplifier circuits, d-3) a second transfer gate unit coupled between the plurality of bit line pairs associated with the other of said two memory cell blocks and said plurality of sense amplifier circuits, and responsive to a second transfer signal complementary to said first transfer signal for transferring said potential differences between said plurality of bit line pairs and said plurality of sense amplifier circuits, d-4) a third transfer gate unit having a plurality of first transfer circuits respectively coupled with said plurality of sense amplifier circuits and responsive to read selecting signals indicative of one of said sense amplifier circuits for selectively entering on-state, each of said plurality of first transfer circuits comprising a series combination of a first switching transistor and a second switching transistor coupled between a first data line of said at least one data line pair and a constant voltage line and a series combination of a third switching transistor and a fourth switching transistor coupled between a second data line of said at least one data line pair and said constant voltage line, said first and third switching transistors of each first transfer circuit concurrently turning on in the presence of said read selecting signals indicative of the associated sense amplifier circuit, the potential difference of the associated sense amplifier circuit being supplied to the gate electrodes of said second and fourth switching transistors for complementarily changing said second and fourth switching transistors between on-state and off-state, and d-5) a fourth transfer gate unit having a plurality of second transfer circuits coupled with said plurality of sense amplifier circuits and responsive to write selecting signals indicative of one of said sense amplifier circuits for selectively entering on-state;

e) at least one data line pair arranged in parallel to said plurality of bit line pairs, and coupled with both third and fourth transfer gate units;

f) a column selecting system coupled with said third and fourth transfer gate units, and selectively producing said read selecting signals and said write selecting signals for selectively coupling said at least one data line pair with said plurality of sense amplifier circuits; and g) a read/write amplifier unit operative to selectively drive said at least one data line pair for producing potential differences thereon.

6. A semiconductor memory device as set forth in claim 5, in which each of said plurality of second transfer circuits comprises a series combination of a fifth switching transistor and a sixth switching transistor coupled between a first node of the associated sense amplifier circuit and said constant voltage line and a series combination of a seventh switching transistor and an eighth switching transistor coupled between a node of said associated sense amplifier circuit and said constant voltage line, said fifth and seventh switching transistors of each second transfer circuit concurrently turning on in the presence of said write selecting signals indicative of the associated sense amplifier circuit, the potential difference on the at least one data line pair being supplied to the gate electrodes of said sixth and eighth switching transistors for complementarily changing said sixth and eighth switching transistors between on-state and off-state.

* * * * *